United States Patent
Chen et al.

(10) Patent No.: US 9,040,385 B2
(45) Date of Patent: May 26, 2015

(54) MECHANISMS FOR CLEANING SUBSTRATE SURFACE FOR HYBRID BONDING

(71) Applicant: Taiwan Semiconductor Manufacturing Co., Ltd., Hsin-Chu (TW)

(72) Inventors: Sheng-Chau Chen, Kaohsiung (TW); Chih-Hui Huang, Yongkang (TW); Yeur-Luen Tu, Taichung (TW); Cheng-Ta Wu, Shueishang Township (TW); Chia-Shiung Tsai, Hsin-Chu (TW); Xiao-Meng Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 72 days.

(21) Appl. No.: 13/949,756

(22) Filed: Jul. 24, 2013

(65) Prior Publication Data
US 2015/0031189 A1    Jan. 29, 2015

(51) Int. Cl.
| | |
|---|---|
| H01L 21/30 | (2006.01) |
| H01L 21/02 | (2006.01) |
| H01L 21/768 | (2006.01) |
| H01L 21/18 | (2006.01) |
| H01L 21/67 | (2006.01) |
| H01L 33/00 | (2010.01) |

(52) U.S. Cl.
CPC .... *H01L 21/02068* (2013.01); *H01L 21/76843* (2013.01); *H01L 21/187* (2013.01); *H01L 21/67017* (2013.01); *H01L 21/02334* (2013.01); *H01L 33/0079* (2013.01); *H01L 21/02041* (2013.01); *H01L 21/02074* (2013.01); *Y10S 438/906* (2013.01)

(58) Field of Classification Search
CPC .................... H01L 21/02301; H01L 21/02334
See application file for complete search history.

(56) References Cited

U.S. PATENT DOCUMENTS

2006/0281298 A1* 12/2006 Noguchi et al. .............. 438/622

* cited by examiner

*Primary Examiner* — Cheung Lee
(74) *Attorney, Agent, or Firm* — Birch, Stewart, Kolasch & Birch, LLP

(57) ABSTRACT

Embodiments of mechanisms for cleaning a surface of a semiconductor wafer for a hybrid bonding are provided. The method for cleaning a surface of a semiconductor wafer for a hybrid bonding includes providing a semiconductor wafer, and the semiconductor wafer has a conductive pad embedded in an insulating layer. The method also includes performing a plasma process to a surface of the semiconductor wafer, and metal oxide is formed on a surface of the conductive structure. The method further includes performing a cleaning process using a cleaning solution to perform a reduction reaction with the metal oxide, such that metal-hydrogen bonds are formed on the surface of the conductive structure. The method further includes transferring the semiconductor wafer to a bonding chamber under vacuum for hybrid bonding. Embodiments of mechanisms for a hybrid bonding and a integrated system are also provided.

20 Claims, 5 Drawing Sheets

MECHANISMS FOR CLEANING SUBSTRATE SURFACE FOR HYBRID BONDING

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are in direct or indirect contact. The like elements are identified by the same reference numbers, and thus are not repeated for brevity.

Hybrid bonding is a bonding process used for bonding substrates for forming 3DIC. Hybrid bonding involves at least two types of bondings, such as metal-to-metal bonding and nonmetal-to-nonmetal bonding.

Figure 1:
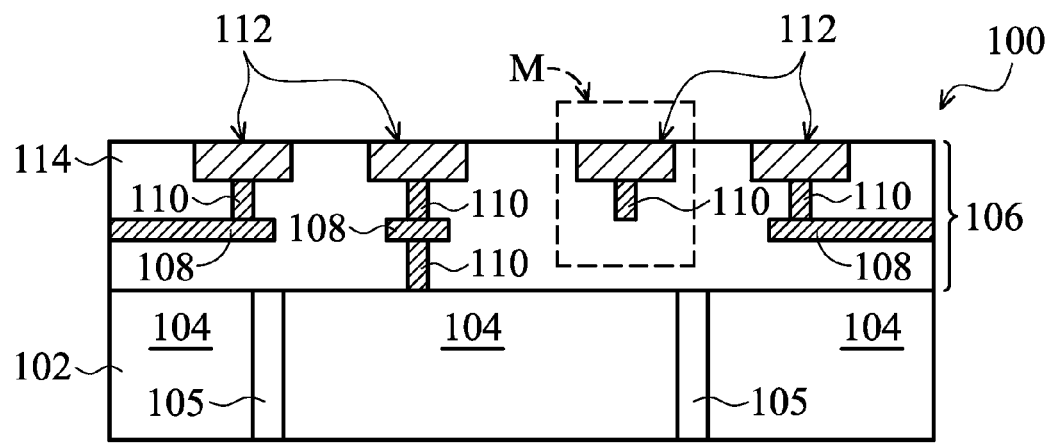
FIG. 1 shows a cross-sectional representation of a portion of a semiconductor wafer, in accordance with some embodiments.

FIG. 1 shows a cross-sectional representation of a portion of a semiconductor wafer 100, in accordance with some embodiments. One or more semiconductor wafers similar to semiconductor wafer 100 may be bonded to semiconductor wafer 100 to form 3DIC structures. Semiconductor wafer 100 includes a semiconductor substrate 102, which is made of silicon or other semiconductor materials. Substrate 102 may include silicon oxide over single-crystal silicon. Compound semiconductors, GaAs, InP, Si/Ge, or SiC may be used in place of silicon. Substrate 102 may be a silicon-on-insulator (SOI) or a germanium-on-insulator (GOI) substrate.

Substrate 102 includes device regions 104 formed proximate a top surface of substrate 102. Device regions 104 may have various device elements. Examples of device elements, which are formed in substrate 102, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other applicable elements. Various processes are performed to form the device elements, such as deposition, etching, implantation, photolithography, annealing, and/or other suitable processes. In some embodiments, device regions 104 are formed in substrate 102 in a front-end-of-line (FEOL) process. In some embodiments, substrate 102 further includes through-substrate vias (TSVs) 105 filled with a conductive material(s) that provides connections from a bottom side to a top side of substrate 102.

A metallization structure 106 is formed over substrate 102, e.g., over device regions 104. In some embodiments, metallization structure 106 is formed in a back-end-of-line (BEOL) process. Metallization structure 106 includes interconnect structures, such as conductive lines 108, vias 110, and conductive pads (conductive structures) 112. Conductive pads 112 are contact pads (or bond pads) formed in a top surface of semiconductor wafer 100, as shown in FIG. 1. Some vias 110 couple conductive pads 112 to conductive lines 108 in metallization structure 106, and other vias 110, along with conductive metal lines 108, couple conductive pads 112 to device regions 104 of substrate 102. Vias 110 may also connect conductive lines 108 in different metallization layers (not shown).

In some embodiments, conductive lines 108, vias 110, and conductive pads 112 respectively include conductive materials such as copper (Cu), aluminum (Al), tungsten (W), titanium (Ti), or tantalum (Ta).

As shown in FIG. 1, conductive pads 112 are formed in an insulating material 114. Insulating material 114 is a dielectric material, such as silicon dioxide, silicon oxide, silicon nitride, silicon oxynitride, or undoped silicon glass (USG), phosphorus doped oxide (PSG), boron doped oxide (BSG), or boron phosphorus doped oxide (BPSG). In some embodiments, insulating layer 114 is formed by plasma-enhanced chemical vapor deposition (PECVD). In some embodiments, insulating material 114 includes multiple dielectric layers of dielectric materials. However, metallization structure 106 shown is merely for illustrative purposes. Metallization structure 106 may include other configurations and may include one or more conductive lines and via layers.

A region M in FIG. 1 is used to illustrate the mechanisms for cleaning a surface of semiconductor wafer 100 for hybrid bonding in following descriptions, in accordance with some embodiments. As shown in FIG. 1, region M includes conductive pad 112 disposed above via 110. Conductive pad 112 and via 110 are surrounded by insulating material 114.

Figure 2:
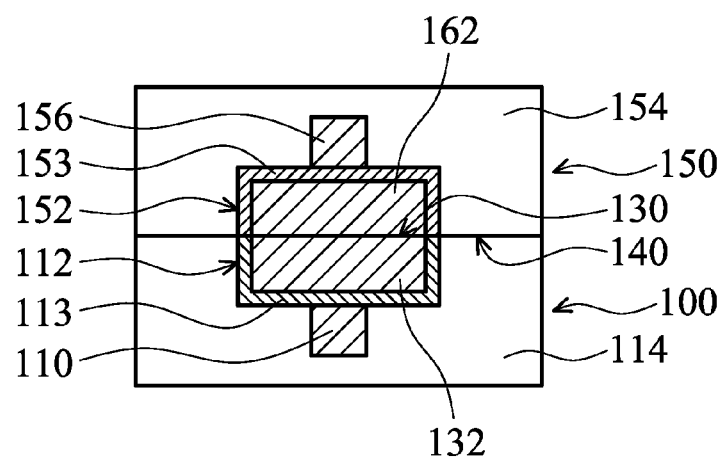
FIG. 2 shows a cross-sectional representation of a bonding structure, in accordance with some embodiments.

FIG. 2 shows a cross-sectional representation of a bonding structure, in accordance with some embodiments. In FIG. 2, semiconductor wafer 100 is bonded to semiconductor wafer 150 by hybrid bonding. It is noted that although FIG. 2 only shows some elements of semiconductor wafers 100 and 150 (e.g. those elements shown in region M in FIG. 1), other elements may also be included in semiconductor wafers 100 and 150. As described above, wafer 100 includes conductive pad 112 formed over via 110. Conductive pad 112 and via 110 are surrounded by insulating material 114. In some embodiments, an opening is formed and filled with a conductive material 132. In some embodiments, conductive material 132 is made of copper (Cu), aluminum (Al), tungsten (W), titanium (Ti), tantalum (Ta), or other applicable materials. In some embodiments, conductive material 132 is made of copper or copper alloy. Due to the concern of metal (such as copper) diffusion in insulating layer 114, conductive pad 112 also includes a diffusion barrier layer 113 to block copper diffusion, in accordance with some embodiments. However, when conductive material 132 is not copper (e.g. Al), diffusion barrier layer 113 is not required. In some embodiments, diffusion barrier layer 113 is made of titanium (Ti), tantalum (Ta), titanium nitride (TiN), tantalum nitride (TaN), or aluminum nitride (AlN), or multiple layers thereof or combinations thereof. In some embodiments, diffusion barrier layer 113 is made of a copper diffusion barrier material. In some embodiments, diffusion barrier layer 113 is made of polymers, such as benzocyclobutene (BCB) polymer. In some embodiments, diffusion barrier layer 113 has a thickness in a range from about 10 Å to about 1000 Å.

Semiconductor wafer 150 is similar to semiconductor wafer 100 and includes a conductive pad 152, a via 156, and an insulating material 154. Conductive pad 152 is similar to conductive pad 112, and via 156 is similar to via 110. Insulating material 154 is similar to insulating material 114. Conductive pad 152 includes a conductive material 162 and a diffusion barrier layer 153. Conductive material 162 is similar to conductive material 132, and diffusion barrier layer 153 is similar to diffusion barrier layer 113.

Before semiconductor wafer 100 is bonded to semiconductor wafer 150, semiconductor wafers 100 and 150 are aligned, such that conductive pad 112 can be bonded to conductive pad 152 and insulating material 114 can be bonded to insulating material 154 during the subsequent hybrid bonding. In some embodiments, the alignment of semiconductor wafers 100 and 150 is achieved by using an optical sensing method.

After the alignment is performed, semiconductor wafers 100 and 150 are pressed together and the temperature is raised to allow the bonds to be formed between the conductive layers and between the insulating layers of semiconductor wafers 100 and 150. As shown in FIG. 2, the bonding structure has an interface 130 between two conductive pads 112 and 152 with metal-to-metal bonding and an interface 140 between two insulating materials 114 and 154 with nonmetal-to-nonmetal bonding. In some embodiments, the nonmetal-to-nonmetal bonding is dielectric-to-dielectric bonding.

Some crack may form at interface 130 between two conductive pads 112 and 152 due to insufficient cleaning of metal surface and/or formation of metal oxide at interface 130. Cracking at interface 130 is undesirable and can reduce yield. Therefore, mechanisms for cleaning the metal surfaces of conductive materials 132 and 152 and removal of metal oxides on the metal surfaces are needed.

FIGS. 3A-3F show cross-sectional representations of various stages of cleaning the surface of semiconductor wafer 100 for hybrid bonding, in accordance with some embodiments. In order to keep the description simplified, FIG. 3A only shows a portion of the semiconductor wafer 100.

Figure 3A:
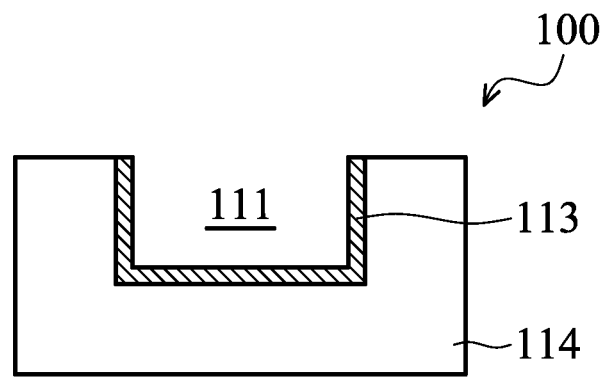
FIGS. 3A-3F show cross-sectional representations of various stages of cleaning a surface of a semiconductor wafer for hybrid bonding, in accordance with some embodiments.

As shown in FIG. 3A, an opening 111 is formed in insulating material 114. In some embodiments, insulating material 114 is patterned by using a photolithography process to form opening 111. In addition, due to the concern of metal (such as copper) diffusion in insulating layer 114, diffusion barrier layer 113 is deposited to line opening 111 in accordance with some embodiments.

Figure 3B:
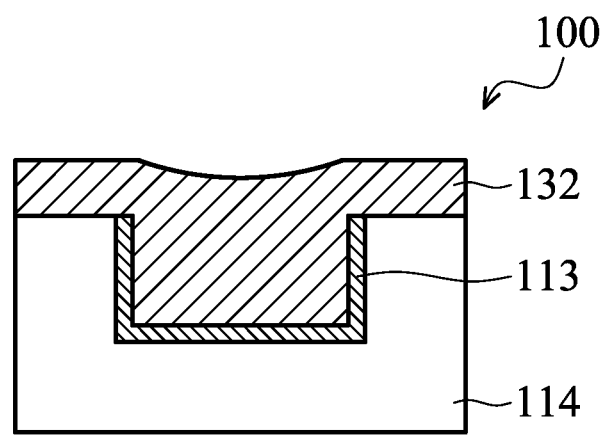

As shown in FIG. 3B, conductive material 132 is used to fill opening 111. In some embodiments, conductive material 132 is formed by a deposition method. The deposition method includes a plating method (such as an electrical chemical plating (ECP) method).

Figure 3C:
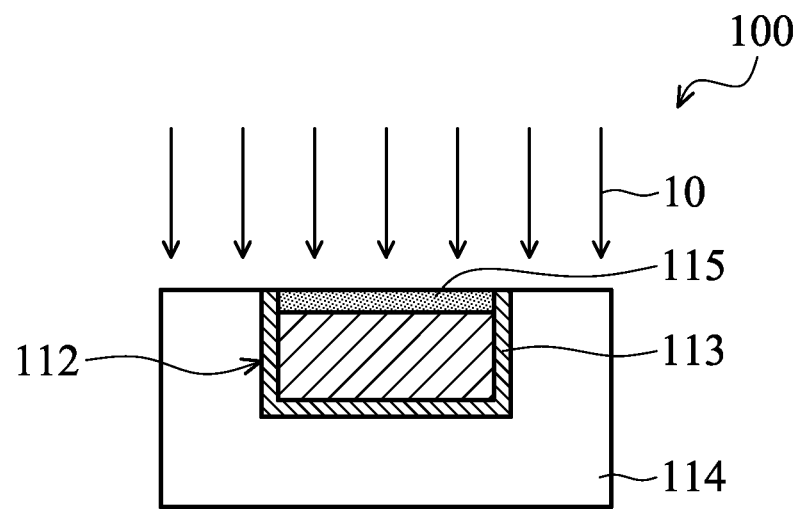

The excess portion of conductive material 132 is removed from a top surface of insulating material 114 to form conductive pad 112, as shown in FIG. 3C. In some embodiments, conductive material 132 outside of opening 111 is removed by a chemical mechanical polishing (CMP) process 10. In some embodiments, after CMP process 10, a metal oxide layer 115 is formed on the surface of conductive pad 112. In some embodiments, metal oxide layer 115 is made of copper oxide ($CuO_x$). Metal oxide will result in weakening the bonding strength of metal-to-metal bonding, and therefore metal oxide needs to be removed. In order to remove metal oxide layer 115, a post CMP cleaning process is performed. In some embodiments, a cleaning solution used in the post CMP cleaning process includes deionized (DI) water, $NH_4OH$, or a variety of acids and bases. The cleaning process may include a brush clean, a mega-sonic clean, or combinations thereof. Alternatively, the cleaning process may include other types of chemical and cleaning procedures. In some embodiments, after the post CMP cleaning process, a portion of metal oxide layer 115 still remains on the top surface of conductive pad 112.

Figure 3D:
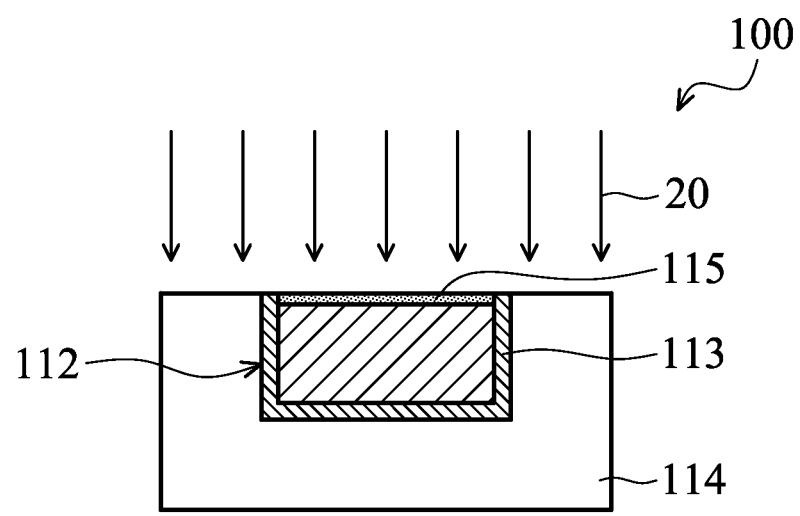

The top surface of semiconductor wafer 100 is treated to assist hybrid bonding in subsequent processes. As shown in FIG. 3D, the top surface of semiconductor wafer 100 is treated by a plasma process 20. During plasma process 20, the top surface of semiconductor wafer 100 is exposed to the plasma, such that insulating material 114 can be bonded to insulating material 154 (as shown in FIG. 2) in subsequent processes. In some embodiments, insulating material 114 is $SiO_2$, and Si—O bonds are formed at the top surface of insulating material 114 after plasma process 20. In some embodiments, nitrogen ($N_2$) or argon (Ar) is used in plasma process 20. In some embodiments, plasma process 20 includes using Ar in a range from about 80% to about 100% and using $H_2$ in a range from about 0% to about 20% (in volume). In some embodiments, plasma process 20 includes using He in a range from about 80% to about 100% and using $H_2$ in a range from about 0% to about 20% (in volume). When hydrogen is used in plasma process 20, a portion of metal oxide layer 115 is converted to metal. However, some metal oxide still remains on conductive pad 112. In some other embodiments, the top surface of semiconductor wafer 100 is treated by other types of treatments.

Figure 3E:
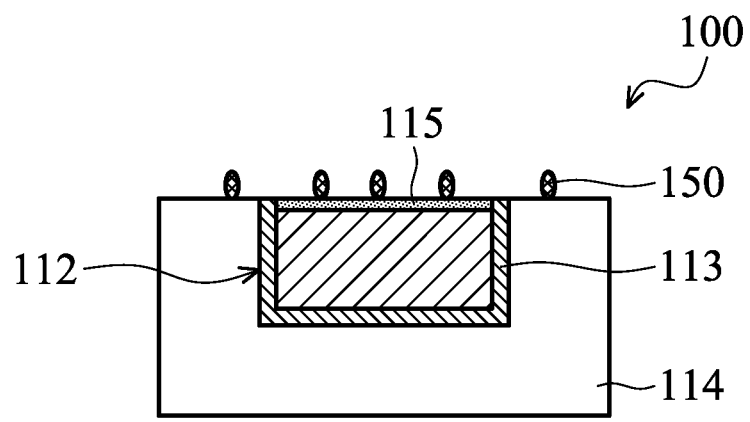

After plasma process 20, residues 150 are formed on the top surface of semiconductor wafer 100, as shown in FIG. 3E. As mention above, some metal oxide layer 115 still remains on the top surface of conductive pad 112, as shown in FIG. 3F.

Figure 3F:
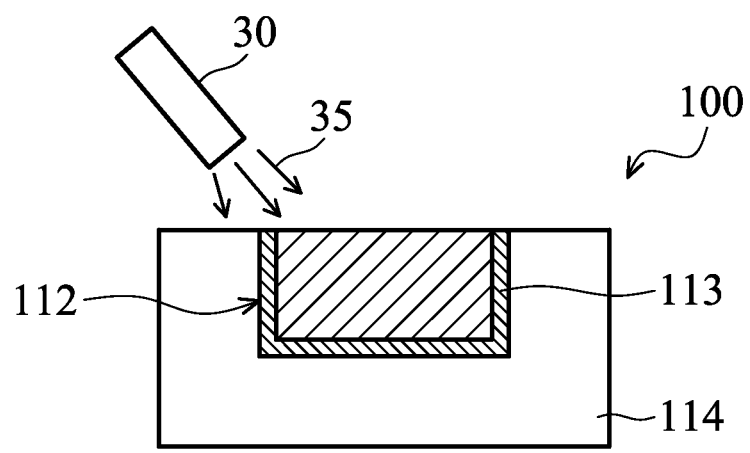

Referring to FIG. 3F, after plasma process 20, the top surface of semiconductor wafer 100 is cleaned by a cleaning process. FIG. 3F shows a cleaning solution supplier 30 (such as nozzle) positioned over the top surface of semiconductor wafer 100 to supply a cleaning solution 35. Cleaning solution 35 may include citric acid, hydrofluoric acid (HF), or tetramethylammonium hydroxide (TMAH). In some embodiments, residues 150 are removed by cleaning solution 35, and metal oxide layer 115 is reduced to form metal-hydrogen bonds during the cleaning process.

In some embodiments, cleaning solution 35 contains citric acid (CA), and the cleaning process includes the following reactions.

$$2CuOx + 2CA \rightarrow 2[Cu/CA] + xO_2 \qquad (1)$$

$$[Cu/CA] + H \rightarrow [Cu/H] + CA \qquad (2)$$

Referring to equation (1), the metal oxide, such as CuOx, of the metal oxide layer 115 is reacted with citric acid to form a complex [Cu/CA]. The citric acid is replaced by the hydrogen ion (H$^+$) in cleaning solution 35 to form [Cu/H], which contains copper-hydrogen bonds (see equation (2)). Therefore, metal oxide layer 115 is reduced to form metal-hydrogen bonds by a reduction reaction during the cleaning process. In addition, these metal-hydrogen bonds protect the surface of conductive pad 112 from oxidation before hybrid bonding is performed. Moreover, the metal-hydrogen bonds can be easily broken to form metal-to-metal bonding during hybrid bonding.

In some embodiments, the citric acid has a concentration in a range from about 0.25% to about 10%. In some embodiments, the hydrofluoric acid (HF) has a concentration in a range from 0.1% to about 0.5%. In some other embodiments, tetramethylammonium hydroxide (TMAH) has a concentration in a range from about 0.25% to about 0.5%.

The processes described above and illustrated in FIG. 3A to FIG. 3F are also performed to semiconductor wafer 150 shown in FIG. 2, and details of the processes are not repeated herein. After both wafers 100 and 150 are cleaned by the cleaning process, semiconductor wafers 100 and 150 are aligned, such that conductive pad 112 is aligned to conductive pad 152 and insulating layer 114 is aligned to insulating layer 154 (as shown in FIG. 2).

After the alignment is performed, semiconductor wafers 100 and 150 are hybrid bonded together by applying pressure and heat. Hybrid bonding may be performed in an inert environment filled with such as N$_2$, Ar, He, or combinations thereof. In some embodiments, the pressure for hybrid bonding is in a range from about 10 kPa to about 200 kPa. In some embodiments, the heat applied to bond semiconductor wafers 100 and 150 includes an anneal operation at a temperature in a range from about 300° C. to about 400° C. Alternatively, the pressure and temperature used for hybrid bonding may be adjusted as required.

Since the top surfaces of semiconductor wafers 100 and 150 are cleaned, no residues 150 and metal oxide layer 115 are left to block the bonding between semiconductor wafers 100 and 150. As a result, the bonding strength between conductive pads 112 and 152 is improved, and the interfacial cracking is resolved or greatly improved.

Figure 4:
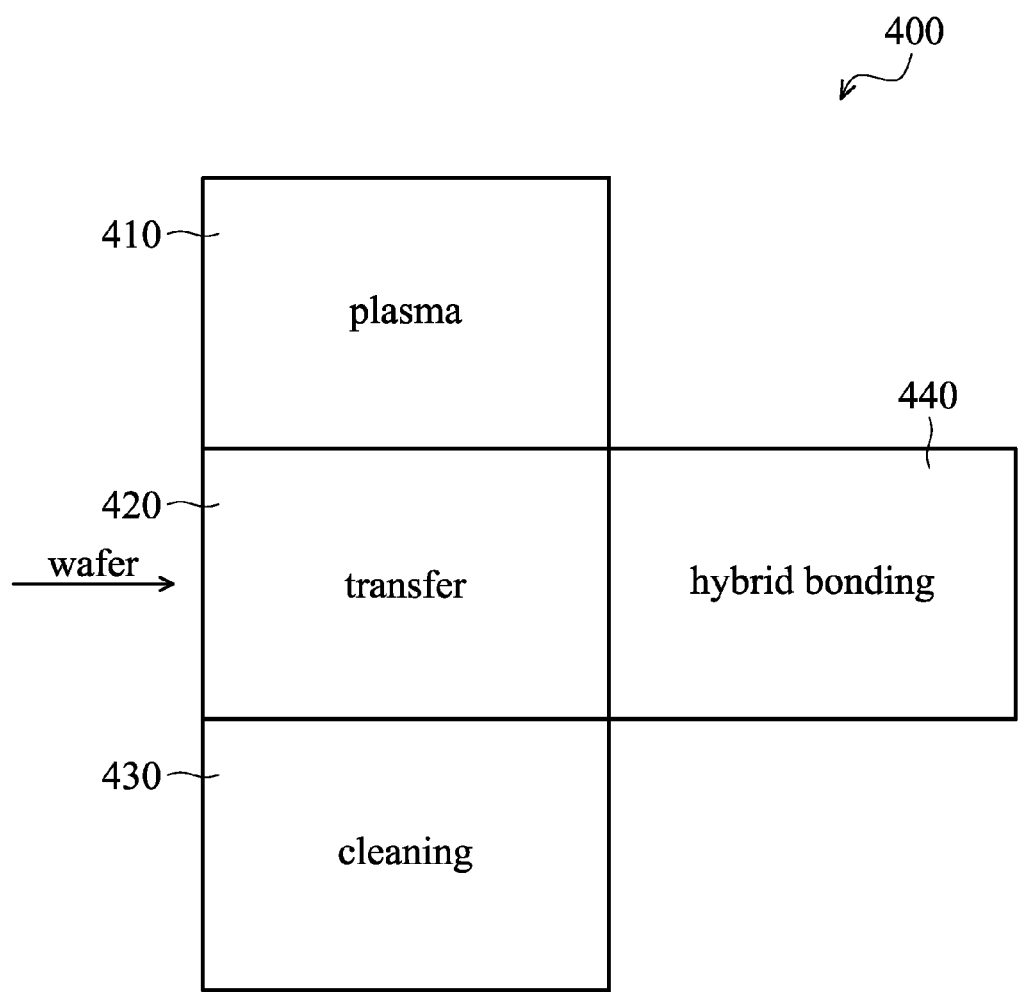
FIG. 4 shows an integrated system for hybrid bonding, in accordance with some embodiments.

FIG. 4 shows an integrated system 400 for hybrid bonding, in accordance with some embodiments. Integrated system 400 includes a plasma chamber 410, a transfer chamber 420, a cleaning chamber 430, and a hybrid bonding chamber 440. Plasma chamber 410, cleaning chamber 430, and hybrid bonding chamber 440 are attached aside of transfer chamber 420. Since plasma chamber 410, cleaning chamber 430, and hybrid bonding chamber 440 are all coupled to transfer chamber 420, semiconductor wafers 100 and 150 can be transferred from one chamber to another chamber via transfer chamber 420 under vacuum. In some embodiments, a robot (not shown) is disposed in transfer chamber 420, and the robot is configured to transfer semiconductor wafers 100 and 150 to the desired chamber. For example, the robot is configured to transfer semiconductor wafers 100 and 150 from plasma chamber 410 (for plasma treatment) to cleaning chamber 430 (for cleaning) and then to hybrid bonding chamber 440 (for hybrid bonding).

For example, semiconductor wafer 100 is first placed on the robot in transfer chamber 420. Afterwards, the robot transfers semiconductor wafer 100 to plasma chamber 410 for plasma process 20 shown in FIG. 3D. After plasma process 20, semiconductor wafer 100 is transferred to cleaning chamber 430 by the robot for the cleaning process shown in FIG. 3F. Semiconductor wafer 100 is then transferred to hybrid bonding chamber 440 and remained in hybrid bonding chamber 440 until semiconductor wafer 150 is ready to be bonded. Semiconductor wafer 150 is also processed in integrated system 400 by the processes described above. That is, semiconductor wafer 150 is also place in transfer chamber 420 and then transferred to plasma chamber 410, cleaning chamber 430, and hybrid bonding chamber 440. After semiconductor wafer 100 and 150 are both transferred into hybrid bonding chamber 440, semiconductor wafer 100 is bonded to semiconductor wafer 150 to form the bonding structure by hybrid bonding in hybrid bonding chamber 440. In some embodiments, the processes that transferring semiconductor wafers 100 and 150 from one chamber to another chamber are all performed under vacuum, such that reformation of metal oxide is avoided.

In the process described above, the cleaning process is performed to remove residues 150 and metal oxide layer 115 before hybrid bonding. In addition, since semiconductor wafer 100 and 150 are transferred from one chamber to another chamber in integrated system 400 under vacuum, semiconductor wafers 100 and 150 do not leave integrated system 400 during the processes. Therefore, reformation of metal oxides (such as CuOx) on the top surface of conductive pads 112 and 152 is avoided, and the hybrid bonding strength between two bonding semiconductor wafers 100 and 150 is improved.

Embodiments of mechanisms for cleaning surfaces of semiconductor wafers for hybrid bonding are provided. Each semiconductor wafer includes a conductive pad surrounded by an insulating layer and a metal oxide layer formed on the top surface of the conductive pad. The surfaces of the semiconductor wafers are treated with plasma first and then cleaned by using a cleaning process after a plasma process. During the cleaning process, residues formed on the top surfaces of the semiconductor wafers are removed by a cleaning solution. In addition, the metal oxide layer formed on the conductive pads of the semiconductor wafers are reduced by the acid in the cleaning solution, and metal-hydrogen bonds are formed on the conductive pads to protect the conductive pads. The cleaned semiconductor wafers are bonded together to form a bonding structure by hybrid bonding. The processes of preparing and bonding the semiconductor wafers, including the plasma process, the cleaning process, and hybrid bonding, are performed in an integrated system. The wafers are transferred from one chamber to another in the integrated system under vacuum to prevent metal oxidation. Therefore, reformation of metal oxide can be avoided, and the hybrid bonding quality is greatly improved.

In some embodiments, a method for cleaning a surface of a semiconductor wafer for a hybrid bonding is provided. The method includes providing a semiconductor wafer, and the semiconductor wafer has a conductive pad embedded in an insulating layer and metal oxide formed on a surface of the conductive pad. The method also includes performing a plasma process to a surface of the semiconductor wafer. The method further includes performing a cleaning process using a cleaning solution to the surface of the semiconductor wafer after the plasma process, and the metal oxide is reduced and metal-hydrogen bonds are formed on the surface of the conductive pad. The method further includes transferring the semiconductor wafer to a bonding chamber under vacuum for hybrid bonding.

In some embodiments, a hybrid bonding for semiconductor wafers is provided. The hybrid bonding includes providing a first semiconductor wafer and a second semiconductor wafer, and the first semiconductor wafer and the second semiconductor wafer each has a conductive pad embedded in an insulating layer. The hybrid bonding also includes performing a plasma process to surfaces of the first semiconductor wafer and the second semiconductor wafer respectively. The hybrid bonding further includes performing a cleaning process using a cleaning solution to the surface of the first semiconductor wafer and the surface of the second semiconductor wafer respectively. The hybrid bonding also includes bonding the first semiconductor wafer to the second semiconductor wafer.

In some embodiments, an integrated system for hybrid bonding is provided. The integrated system includes a plasma chamber coupled to a transfer chamber and a cleaning chamber coupled to the transfer chamber. The integrated system further includes a hybrid bonding chamber coupled to the transfer chamber, and the hybrid bonding chamber is configured to bond two semiconductor wafers to form metal-to-metal bonding and non-metal-to-non-metal bonding.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for cleaning a surface of a semiconductor wafer for hybrid bonding, comprising:
   providing a semiconductor wafer, wherein the semiconductor wafer has a conductive pad embedded in an insulating layer and a metal oxide layer formed on a surface of the conductive pad;
   performing a plasma process to a surface of the semiconductor wafer;
   performing a cleaning process using a cleaning solution to the surface of the semiconductor wafer after the plasma process, wherein the metal oxide layer is reduced and metal-hydrogen bonds are formed on the surface of the conductive pad; and
   transferring the semiconductor wafer to a bonding chamber under vacuum for hybrid bonding.

2. The method as claimed in claim 1, wherein the cleaning solution comprises citric acid, hydrofluoric acid (HF), or tetramethylammonium hydroxide (TMAH).

3. The method as claimed in claim 2, wherein the citric acid has a concentration in a range from about 0.25% to about 10%.

4. The method as claimed in claim 2, wherein the hydrofluoric acid (HF) has a concentration in a range from about 0.1% to about 0.5%.

5. The method as claimed in claim 2, wherein the tetramethylammonium hydroxide (TMAH) has a concentration in a range from about 0.25% to about 0.5%.

6. The method as claimed in claim 1, wherein providing the semiconductor wafer further comprises:
   forming an opening in the insulating layer;
   forming a diffusion barrier layer to line the opening; and
   forming a conductive material on the diffusion barrier layer to form the conductive pad.

7. The method as claimed in claim 6, wherein the diffusion barrier layer is made of titanium (Ti), tantalum (Ta), titanium nitride (TiN), tantalum nitride (TaN), or aluminum nitride (AlN).

8. The method as claimed in claim 1, wherein the insulating layer is made of silicon dioxide, silicon oxide, silicon nitride, silicon oxynitride, or undoped silicon glass (USG), phosphorus doped oxide (PSG), boron doped oxide (BSG), or boron phosphorus doped oxide (BPSG).

9. The method as claimed in claim 1, wherein the conductive pad includes a conductive material made of copper (Cu), aluminum (Al), tungsten (W), titanium (Ti), or tantalum (Ta).

10. The method as claimed in claim 1, wherein performing a plasma process comprises:
    exposing the surface of the semiconductor wafer to argon (Ar) or nitrogen ($N_2$).

11. The method as claimed in claim 1, further comprising:
    performing a chemical mechanical polishing (CMP) process to the surface of the semiconductor wafer before performing the plasma process; and
    performing a post CMP cleaning process after the chemical mechanical polishing process and before performing the plasma process.

12. The method as claimed in claim 1, wherein performing the plasma process, performing the cleaning process, and transferring the semiconductor wafer to the bonding chamber are all performed in an integrated system.

13. A hybrid bonding for semiconductor wafers, comprising:
    providing a first semiconductor wafer and a second semiconductor wafer, wherein the first semiconductor wafer and the second semiconductor wafer each has a conductive pad embedded in an insulating layer;
    performing a plasma process to a surface of the first semiconductor wafer and a surface of the second semiconductor wafer respectively;
    performing a cleaning process using a cleaning solution to the surface of the first semiconductor wafer and the surface of the second semiconductor wafer respectively; and bonding the first semiconductor wafer to the second semiconductor wafer.

14. The hybrid bonding as claimed in claim 13, wherein the cleaning solution comprises citric acid, hydrofluoric acid (HF), or tetramethylammonium hydroxide (TMAH).

15. The hybrid bonding as claimed in claim 13, wherein bonding the first semiconductor wafer to the second semiconductor wafer is performed at a temperature in a range from about 300° C. to about 400° C.

16. The hybrid bonding as claimed in claim 13, wherein the hybrid bonding are performed in the following sequence:
   performing the plasma process to the first semiconductor wafer;
   after performing the plasma process to the first semiconductor wafer, performing the cleaning process to the first semiconductor wafer;
   after performing the cleaning process to the first semiconductor wafer, transferring the first semiconductor wafer to a hybrid bonding chamber;
   after transferring the first semiconductor wafer to the hybrid bonding chamber, performing the plasma process to the second semiconductor wafer;
   after performing the plasma process to the second semiconductor wafer, performing the cleaning process to the second semiconductor wafer;
   after performing the cleaning process to the second semiconductor wafer, transferring the second semiconductor wafer to the hybrid bonding chamber;
   after transferring the second semiconductor wafer to the hybrid bonding chamber, bonding the first semiconductor wafer to the second semiconductor wafer.

17. The hybrid bonding as claimed in claim 13, further comprising:
   performing a chemical mechanical polishing (CMP) process to the surface of the first semiconductor wafer and the surface of the second semiconductor wafer before performing the plasma process; and
   performing a post CMP cleaning process after the chemical mechanical polishing process and before performing the plasma process.

18. The hybrid bonding as claimed in claim 13, wherein performing the plasma process, performing the cleaning process, and bonding the first semiconductor wafer to the second semiconductor wafer are all performed in an integrated system.

19. The hybrid bonding as claimed in claim 13, wherein performing the plasma process, performing the cleaning process, and bonding the first semiconductor wafer to the second semiconductor wafer are all performed under vacuum.

20. The hybrid bonding as claimed in claim 13, wherein bonding the first semiconductor wafer to the second semiconductor wafer further comprises:
   forming a bonding structure between the first semiconductor wafer and the second semiconductor wafer, wherein the bonding structure has a metal-to-metal bonding and nonmetal-to-nonmetal bonding.

* * * * *